(12) United States Patent
Bookbinder et al.

(10) Patent No.: US 7,732,359 B2
(45) Date of Patent: Jun. 8, 2010

(54) OPTICAL MEMBER COMPRISING OD-DOPED SILICA GLASS

(75) Inventors: Dana Craig Bookbinder, Corning, NY (US); Michael Lucien Genier, Horseheads, NY (US); Lisa Anne Moore, Corning, NY (US)

(73) Assignee: Corning Incorporated, Corning, NY (US)

( * ) Notice: Subject to any disclaimer, the term of this patent is extended or adjusted under 35 U.S.C. 154(b) by 249 days.

(21) Appl. No.: 11/981,434

(22) Filed: Oct. 31, 2007

(65) Prior Publication Data

US 2008/0131794 A1 Jun. 5, 2008

Related U.S. Application Data

(60) Provisional application No. 60/861,926, filed on Nov. 30, 2006.

(51) Int. Cl.
*C03C 3/06* (2006.01)
*C03C 3/04* (2006.01)
*C03C 13/04* (2006.01)

(52) U.S. Cl. .............................. 501/54; 501/37; 501/53

(58) Field of Classification Search ................... 501/53, 501/54, 37; 385/141
See application file for complete search history.

(56) References Cited

U.S. PATENT DOCUMENTS 6,136,736 A * 10/2000 Rajaram et al. ............... 501/54

6,619,073 B2 * 9/2003 Borrelli et al. ............... 65/30.1
2004/0060327 A1 * 4/2004 Berkey et al. ................ 65/422
2004/0091798 A1 * 5/2004 Moore et al. ................. 430/5

OTHER PUBLICATIONS

V.S. Khotimchenko et al.; "Determining the Content of Hydrogen Dissolved in Quartz Glass Using the Methods of Raman Scattering and Mass Spectrometry"; Translated from Zhurnal Prikladnoi Spektroskopii, vol. 46, No. 6, pp. 987-991, Jun. 1987; Original article was submitted Dec. 30, 1986.
K.M. Davis et al.; "Quantitative Infrared Spectroscopic Measurement of Hydroxyl Concentrations in Silica Glass"; Journal of Non-Crystalline Solids, 203 (1996) 27-36.
A.H. Laufer et al.; Deuterium Isotope Effect in Vacuum-Ultraviolet Absorption Coefficients of Water and Methane; Canadian Journal of Chemistry, vol. 43 (1965) pp. 3487-2490.
K. Awazu et al.; "Gaseous Species and their Photochemical Reaction in $SiO_2$"; Journal of Non-Crystalline Solids, 179 (1994) 214-225.
K. Susa et al.; "Preparation of $D_2O$-treated Sol-Gel Silica Preform and OD absorption bands at IR and near-IR region"; Journal of Non-Crystalline Solids 146 (1992) 81-89.
K. Kajihara, et. al., "Modification of vacuum-ultraviolet absorption of SiOH groups in SiO2 glass with temperature, F2 laser irradiation, and H-D isotope exchange," Journal of Non-Crystalline Solids, 352 (2006) 2307-2310.

* cited by examiner

*Primary Examiner*—Karl E Group
*Assistant Examiner*—Noah S Wiese
(74) *Attorney, Agent, or Firm*—Robert P. Santandrea; Siwen Chen

(57) ABSTRACT

An optical member comprising OD-doped silica glass, optionally doped with fluorine. The optical member is particularly advantageous for use in connection with radiation having a wavelength shorter than about 248 nm. In certain embodiments the optical member can be advantageously used for wavelength as short as about 157 nm.

22 Claims, 6 Drawing Sheets

OPTICAL MEMBER COMPRISING OD-DOPED SILICA GLASS

CROSS-REFERENCE TO RELATED APPLICATIONS

This application claims the benefit of priority to U.S. Provisional Patent Application No. 60/861,926, filed on Nov. 30, 2006, entitled "OPTICAL MEMBER COMPRISING OD-DOPED SILICA GLASS," the content of which is relied upon and incorporated herein by reference in its entirety.

TECHNICAL FIELD

The present invention relates to optical members comprising silica glass. In particular, the present invention relates to optical members comprising OD-doped silica glass suitable for use in optical applications operating at wavelength shorter than about 190 nm. The present invention is useful, for example, in making photomask substrates and other optical elements for use in devices operating at about 157 and 175 nm.

BACKGROUND

Photolithography technology for use in making semiconductor devices has advanced into vacuum UV wavelength ranges due to the requirement of very high resolution of the devices needed for the production of very fine features of modern high-speed, high-performance, low-energy-consumption chips. Special optical materials are being researched and developed for use in the lenses manipulating the UV light at such short wavelength. Synthetic silica has found significant use in such applications.

Nonetheless, there remains a need of an optical member with high transmission and other desired features at short wavelength, especially at or below 193 nm. The present invention satisfies this need.

SUMMARY

Accordingly, in a first aspect, the present invention provides an article member having a light incident axis, comprising OD-doped silica glass having an absorption edge $\lambda(edge) \leq 165$ nm (in certain embodiments $\lambda(edge) \leq 163$ nm; in certain other embodiments $\lambda(edge) \leq 160$ nm, in certain other embodiments $\lambda(edge) \leq 158$ nm; in certain other embodiments $\lambda(edge) \leq 157$ nm; in certain other embodiments $\lambda(edge) \leq 155$ nm; and a refractive index variation, when measured in a plane perpendicular to the axis, less than about 10 ppm, in certain embodiments less than about 5 ppm, in certain other embodiments less than about 3 ppm, in certain other embodiments less than about 3 ppm, in certain other embodiments less than about 1 ppm.

In certain embodiments of the optical member of the present invention, the OD-doped silica glass further comprises doped fluorine.

According to certain embodiments of the optical member of the present invention, the OD-doped silica glass in the optical member comprises less than about 5000 ppm by weight of fluorine, in certain embodiments less than about 3000 ppm, in certain embodiments less than about 1000 ppm, in certain embodiments less than about 800 ppm, in certain embodiments less than about 500 ppm, in certain embodiments less than about 300 ppm, in certain other embodiments less than about 200 ppm, in certain other embodiments less than about 100 ppm, in certain other embodiments less than about 50 ppm, in certain embodiments less than about 10 ppm, in certain embodiments less than about 5 ppm.

According to certain embodiments of the optical member of the present invention, the OD-doped silica glass comprises less than about 50 ppb by weight of Na, in certain embodiments less than about 30 ppb, in certain other embodiments less than about 10 ppb, in certain other embodiments less than about 5 ppb, in certain other embodiments less than about 1 ppb.

According to certain embodiments of the optical member of the present invention, the OD-doped silica glass has a ratio of $n(OD)/(n(OH)+n(OD))$ of higher than about 0.98, in certain embodiments higher than about 0.99.

According to certain embodiments of the optical member of the present invention, the OD-doped silica glass has a $[OD] \leq 200$ ppm by weight, in certain embodiments $[OD] \leq 150$ ppm; in certain other embodiments $[OD] \leq 100$ ppm; in certain other embodiments $[OD] \leq 50$ ppm; in certain other embodiments $[OD] \leq 20$ ppm; in certain other embodiments $[OD] \leq 10$ ppm; in certain other embodiments $[OD] \leq 5$ ppm.

According to certain embodiments of the optical member of the present invention, the OD-doped silica glass is doped with $H_2$ at a concentration such that $[H_2](m)/[OD](m) \leq 0.1$, in certain embodiments $[H_2](m)/[OD](m) \leq 0.08$, in certain other embodiments $[H_2](m)/[OD](m) \leq 0.05$, in certain other embodiments $[H_2](m)/[OD](m) \leq 0.01$, where $[H_2](m)$ and $[OD](m)$ are concentrations of $H_2$ and OD in the glasses in mole·cm$^{-3}$, respectively.

According to certain embodiments of the optical member of the present invention, the OD-doped silica glass is doped with $D_2$ at a concentration of between $[D_2]$, wherein $1 \times 10^{15}$ molecules/cm$^3 \leq [D_2] \leq 1 \times 10^{18}$ molecules/cm$^3$; in certain embodiments $1 \times 10^{15}$ molecules/cm$^3 \leq [D_2] \leq 5 \times 10^{17}$ molecules/cm$^3$; in certain embodiments $1 \times 10^{15}$ molecules/cm$^3 \leq [D_2] \leq 1 \times 10^{17}$ molecules/cm$^3$; in certain embodiments $1 \times 10^{15}$ molecules/cm$^3 \leq [D_2] \leq 5 \times 10^{16}$ molecules/cm$^3$; in certain embodiments $1 \times 10^{16}$ molecules/cm$^3 \leq [D_2] \leq 1 \times 10^{18}$ molecules/cm$^3$; in certain embodiments $1 \times 10^{16}$ molecules/cm$^3 \leq [D_2] \leq 5 \times 10^{17}$ molecules/cm$^3$; in certain embodiments $1 \times 10^{16}$ molecules/cm$^3 \leq [D_2] \leq 1 \times 10^{17}$ molecules/cm$^3$; in certain embodiments $1 \times 10^{16}$ molecules/cm$^3 \leq [D_2] \leq 5 \times 10^{16}$ molecules/cm$^3$.

According to certain embodiments of the optical member of the present invention, the OD-doped silica glass comprises chlorine at a concentration of $[Cl]$, where $[Cl] \leq 10$ ppm by weight, in certain embodiments $[Cl] \leq 5$ ppm, in certain other embodiments $[Cl] \leq 1$ ppm.

According to certain embodiments of the optical member of the present invention, the optical member is a photomask substrate for use at a wavelength shorter than 190 nm.

According to certain embodiments of the optical member of the present invention, the optical member is a photomask substrate for use in photolithography at about 157 nm.

According to certain embodiments of the optical member of the present invention, the optical member is lamp envelope for a light source emitting light with a wavelength shorter than 190 nm.

According to certain embodiments of the optical member of the present invention, the optical member is a refractive lens element for use in connection with a laser at about 165 nm.

According to certain embodiments of the optical member of the present invention, the optical member is a refractive lens element for use in connection with an excimer laser at about 157 nm n.

According to certain embodiments of the optical member of the present invention, the optical member is an optical waveguide for transmitting light irradiation. In certain embodiments, the waveguide is or comprises an optical fiber.

According to certain embodiments of the optical member of the present invention, the optical member is a pellicle of a photomask for use at lithographic device operating at a wavelength shorter than 175 nm.

According to certain embodiments of the optical member of the present invention, the OD-doped silica glass has an initial transmission at about 157 nm of at least 50%/cm, in certain embodiments at least 60%/cm, in certain other embodiments at least 70%/cm.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that the foregoing general description and the following detailed description are merely exemplary of the invention, and are intended to provide an overview or framework to understanding the nature and character of the invention as it is claimed.

The accompanying drawings are included to provide a further understanding of the invention, and are incorporated in and constitute a part of this specification.

DETAILED DESCRIPTION

Figure 1:
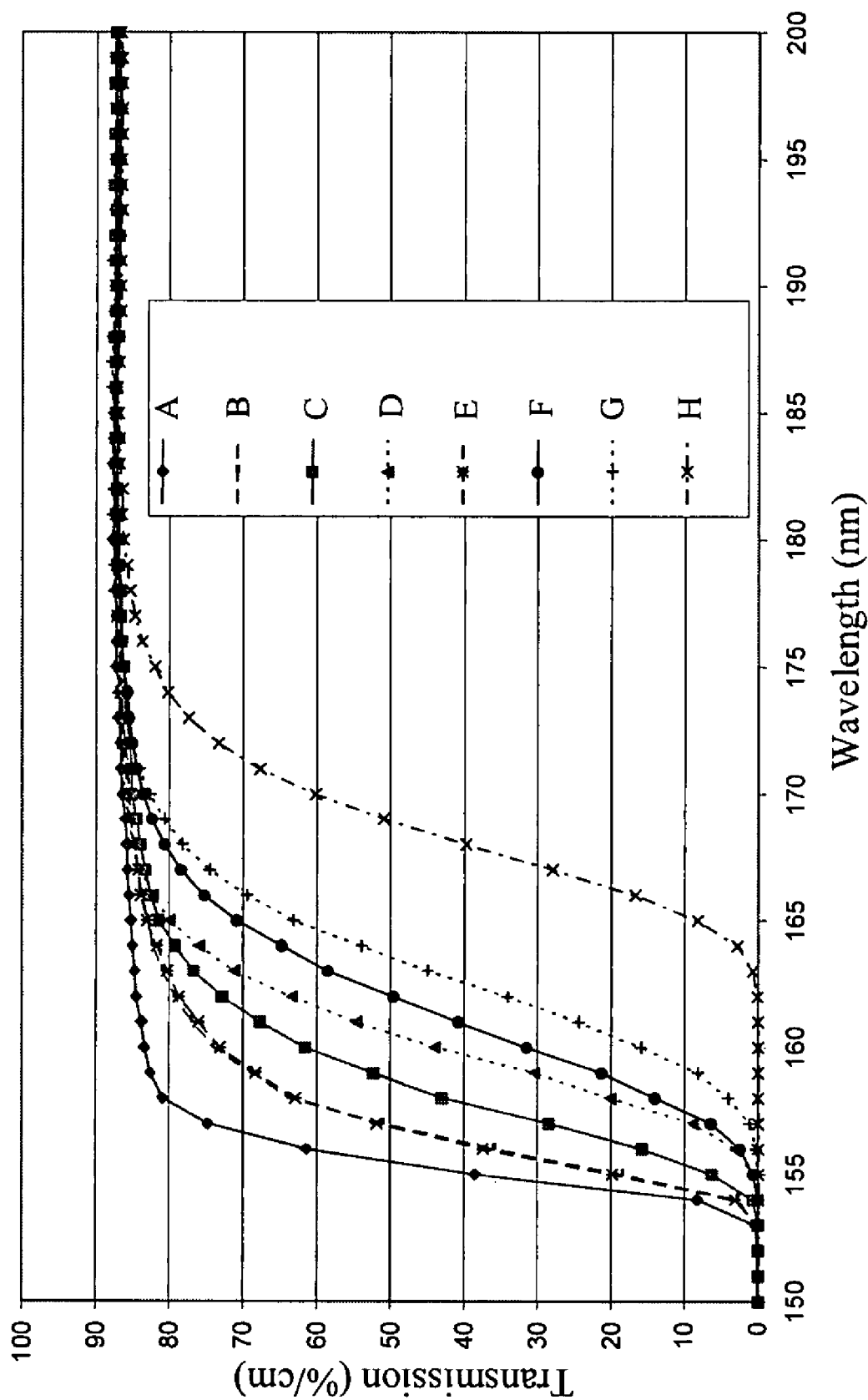
FIG. 1 is a diagram showing the transmission of a series of silica glasses in wavelength range from about 150 nm to about 200 nm.

The following description of the invention is provided as an enabling teaching of the invention in its best, currently known embodiment. To this end, those skilled in the relevant art will recognize and appreciate that many changes can be made to the various embodiments of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

Unless otherwise indicated, all numbers such as those expressing weight percents of ingredients, dimensions, and values for certain physical properties such as electrical potential used in the specification and claims are to be understood as being modified in all instances by the term "about." It should also be understood that the precise numerical values used in the specification and claims form additional embodiments of the invention. Efforts have been made to ensure the accuracy of the numerical values disclosed in the Examples. Any measured numerical value, however, can inherently contain certain errors resulting from the standard deviation found in its respective measuring technique.

As used herein, the singular forms "a," "an" and "the" include plural referents unless the context clearly dictates otherwise. Thus, for example, reference to an "electrical contact point" includes embodiments having two or more such electrical contact points unless the context clearly indicates otherwise; and reference "a target substance" and "a candidate" includes embodiments having two or more target substances and candidates, respectively, unless the context clearly indicates otherwise.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

As used herein, a "wt. %" or "weight percent" or "percent by weight" of a component, unless specifically stated to the contrary, is based on the total weight of the composition or article in which the component is included.

As used herein, the term "D-containing compound" means a chemical compound or an elemental substance comprising deuterium atom(s) ($_1^2$ D, "D") and optionally protium atom(s) ($_1^1$ H, "H"), in which the ratio of n(D)/(n(D)+n(H)) is higher than the natural isotopic abundance of D, where n(D) is the total number of D atoms in the molecule of the D-containing compound, and n(H) is the total number of H atoms in the molecule of the D-containing compound. Examples of D-containing compound thus include, but are not limited to: $D_2$, DH, $CD_4$, $CDH_3$, $D_2O$, DHO, and the like. As used herein, the term "D-containing" means that an elemental substance, a compound, a material, or an atmosphere in which the ratio of n(D)/(n(D)+n(H)) is higher than the natural isotopic abundance of D.

As used herein, the term "hydroxyl(s)" or OH means a moiety or a group of moieties each consisting of an oxygen atom and a protium atom (H). The oxygen atom may be $^{16}O$, $^{17}O$ or $^{18}O$, or mixtures thereof at any proportion. As used herein, n(OH) means the total number of OH moieties in a material.

As used herein, the term "deuteroxyl(s)" or OD means a moiety or a group of moieties each consisting of an oxygen atom and a deuterium atom (D). The oxygen atom may be $^{16}O$, $^{17}O$ or $^{18}O$, or mixtures thereof at any proportion. As used herein, n(OD) means the total number of OD moieties in a material.

In the present application, the two terms "hydroxyl-doped" and "OH-doped" are used interchangeably. A hydroxyl-doped or OH-doped material means the material comprises OH moieties and optionally OD moieties, and the ratio of n(OH)/(n(OD)+n(OH)) in the material is equal to or higher than the natural isotopic abundance of H. To that extent, a material in which all the OH moieties originate from normal water comprising $H_2O$ and $D_2O$ at essentially the natural isotopic abundances of H and D is regarded as OH-doped.

In the present application, the two terms "deuteroxyl-doped" or "OD-doped" are used interchangeably. A deuteroxyl-doped or OD-doped material means the material comprises OD moieties and optionally OH moieties, and the ratio of n(OD)/(n(OD)+n(OH)) in the material is higher than the natural isotopic abundance of D.

By "F-doped" in the present application, it is meant that the glass comprises at least 1 ppm by weight of fluorine.

As used herein, OD-doped silica means that the silica glass comprises OD moieties in the glass network at an concentration of [OD], where [OD]≧0.1 ppm by weight of the total weight of the glass, and the ratio of n(OD)/(n(OD)+n(OH)) in the glass is at least 95%, where n(OD) is the total number of OD moieties in the glass, and n(OH) is the total number of OH moieties in the glass.

As used herein, "absorption edge" ($\lambda$(edge)) means the wavelength below 300 nm where the glass has a measured transmission of 50%/cm without surface reflection correction. For the purpose of measuring the absorption edge, only initial transmission (i.e., transmission of the glass essentially free of induced absorption due to exposure to UV light) is taken into consideration.

As used herein, "water" in silica glass is meant to include both OH and OD in the glass. OH and OD are known to be present in the glass network as groups directly connected to the silicon atoms: ≡Si—OH and ≡Si—OD.

As used herein, unless otherwise specified, "hydrogen atom" in the present application includes $_1^1H$ and $_1^2D$, and mixtures and combinations thereof at any proportion. In the present application, unless otherwise specified, "hydrogen gas," "molecular hydrogen" and "hydrogen molecule" are used interchangeably to mean $H_2$, $D_2$, HD, and mixtures and combinations thereof at any proportion.

As used herein, the term "variation of refractive index," or "refractive index variation," or "$\Delta n$," means the maximal variation of refractive indices measured in a plane perpendicular to the optical axis of the glass material or glass optical member along a predetermined direction by using interferometry at about 633 nm (He—Ne laser) (with tilt and piston taken out, as indicated infra). As is typically done by one skilled in the art, when discussing refractive index variation along a certain direction, tilt and piston are subtracted. Therefore, the refractive index variation along a certain direction (such as the radial direction in a sample prepared by using the OVD process) in the meaning of the present application does not include tilt or piston. Typically, the optical axis of a glass optical member, a glass blank, or a piece of glass material, is selected to be perpendicular to a plane (a cross-section) in which the measured refractive index inhomogeneity is the smallest, in order to obtain a glass member having large clear aperture area.

The preferred method, also the method used herein, for determination of interstitial molecular $H_2$ in fused silica is Raman scattering. Raman spectrometry is obtained using a T64000 spectrometer from HORIBA JobinYvon Inc. with an EEV charge-coupled device (CCD) detector. The hydrogen molecule concentration in molecules/$cm^3$ was obtained from the ratio of the intensity detected from the hydrogen molecule scattering peak at 4135 $cm^{-1}$ ($I_{4135}$) to the intensity of the silica scattering peak at 800 $cm^{-1}$ ($I_{800}$), i.e., $I_{4135}/I_{800}$, in the laser Raman spectrum (, V. S. Khotimchenkô et al., Prikladnoi Spektroskopii, 46 (6), 987-997 (1986)). More specifically, the intensities of the peaks were determined by integrating the areas under the peaks using a linear or quadratic fit to the background. $D_2$ and HD concentrations in the glass in the present application were measured using Raman spectroscopy as well. $D_2$ concentration was measured at 2973 $cm^{-1}$ and HD concentration was measured at 3606 $cm^{-1}$.

The OH group has characteristic absorption bands near 2.72 μm (3672 $cm^{-1}$), 2.21 μm (4525 $cm^{-1}$) and 1.38 μm (7246 $cm^{-1}$) in fused silica. Concentration of OH was measured by FTIR using the peak height of either the 3672 $cm^{-1}$ or the 4525 $cm^{-1}$ absorption band.

The OH concentration, c, in mol·$liter^{-1}$, is derived from the Beers-Lambert Law $$A = \epsilon \cdot c \cdot b,$$

where the absorbance $A = \log(T_{ref}/T_{OH})$; $T_{ref}$=Transmittance of sample at reference position, a non-absorbing wavelength such as 4000 $cm^{-1}$; $T_{OH}$=Transmittance of sample at OH absorption peak (~3672 $cm^{-1}$ for silica); $\epsilon$ is the molar absorptivity in liter·$mol^{-1}$·$cm^{-1}$; c is concentration in mol·$liter^{-1}$; and b is the pathlength (sample thickness) in cm:

$$c(\text{mol·liter}^{-1}) = A/(\epsilon \cdot b).$$

Concentration of OH in ppm by weight (designated as [OH]) was calculated from c in mol·$liter^{-1}$ using the density of the silica glass (approximately 2.2 g/$cm^3$) and molecular weight of OH (approximately 17 g/mol). The constant c for high purity silica glass at a particular wavelength is available in the prior art (K. M. Davis, et al, "Quantitative infrared spectroscopic measurement of hydroxyl concentration in silica glass," *J. Non-Crystalline Solids*, 203 (1996) 27-36).

Concentration of OD in silica glass was obtained in a similar manner, namely, starting from FTIR measurement and calculated by using the Beers-Lambert Law. To calculate the concentration in parts per million we used the Beers-Lambert law:

$$A' = \epsilon' \cdot c' \cdot b',$$

where the absorbance $A' = \log(T_{ref}/T_{OD})$; $T_{ref}$=Transmittance of sample at reference position, a non-absorbing wavelength such as 2780 $cm^{-1}$; $T_{OD}$=Transmittance of sample at OD absorption peak (~2705 $cm^{-1}$ for silica); $\epsilon'$ is the molar absorptivity in liter·$mol^{-1}$·$cm^{-1}$ (57.4 liter·$mol^{-1}$·$cm^{-1}$ at 2705 $cm^{-1}$); c' is concentration of OD in mol·$liter^{-1}$; and b' is the path length (sample thickness) in cm:

$$c'(\text{mol·liter}^{-1}) = A'/(\epsilon' \cdot b').$$

Concentration of OD in ppm by weight (designated as [OD]) was calculated from c' in mol·$liter^{-1}$ using the density of the silica glass (approximately 2.2 g/$cm^3$) and molecular weight of OD (approximately 18 g/mol). The constant c' for high purity silica glass at a particular wavelength is available in the prior art (K. Susa, et al, "Preparation of $D_2$O-treated sol-gel preform and OD absorption bands at IR and near-IR region," *J. Non-Crystalline Solids*, 146 (1992) 81-89.).

As used herein, a particle preform means an object having a shape and comprising a plurality of solid particles. Thus a particle preform in the present application may be, for example, a soot preform consisting essentially of silica soot particles obtained from flame hydrolysis processes, a green body comprising a number of silica particles obtained from the sol-gel process, and the like.

In copending, co-assigned U.S. patent application Ser. No. 11/348,956, it was described that OD-doped high-purity synthetic silica has unexpected advantageous properties in deep and vacuum UV wavelength. In particular, it was found that OD-doped silica glass has unexpected high laser damage resistance, including, inter alia, low induced absorption, low light induced wavefront distortion (LIWFD), and low polarization-induced-birefringence (PIB) when the glass is exposed to linearly polarized laser irradiation at about 193 nm. These properties, inter alia, render the OD-doped silica glass particularly advantageous for use in immersion microlithographic devices which typically utilizes linearly polarized excimer laser at about 193 nm.

The impact of OH contained in silica glass on the initial transmission of the glass is very small in the wavelength range from about 193 nm to about 400 nm. For example, synthetic silica glass containing about 1000 ppm by weight of OH with high internal transmission at about 193 nm has been prepared by Corning Incorporated, a company located at Corning, N.Y., U.S.A. However, it has been found that, below 193 nm, the presence of OH in a high purity synthetic silica causes much more pronounced absorption in the glass. Such absorption is highly undesirable for many applications.

Recently, the present inventors have found that, OD-doped silica glasses can be particularly advantageously used in optical elements for use at wavelength shorter than 190 nm, such as at about 172 nm, 165 nm and 157 nm, due to the high optical performances of such glasses even at such short wavelengths.

The present inventors have found that OD-doped glass with an OD concentration in mole·cm$^{-3}$ of [OD](m) tends to have an absorption edge at a shorter wavelength than the same silica glass with the exception where the OD is substituted by OH at essentially the same concentration in terms of mole·cm$^3$. For example, a silica glass doped with fluorine, OH and OD at concentrations in terms of mole~cm$^{-3}$ at [F](m), [OH](m) and [OD](m), respectively, when compared with a same glass in which the OD is substituted with OH in the glass (i.e., a glass having a total OH concentration in mole·cm$^{-3}$ of [OD](m)+[OH](m) and a fluorine concentration in terms of mole·cm$^{-3}$ of [F](m)), tends to have an absorption edge at a shorter wavelength. Therefore, OD-doped silica glass essentially free of OH tends to have a higher initial transmission than OH-doped silica glass essentially free of OD with an OH concentration in terms of mole·cm$^{-3}$ essentially the same as the OD concentration in the OD-doped silica glass.

It has been found by the present inventors that in deep UV and vacuum UV wavelength ranges, both OH and OD included in the glass impacts the absorption edge and initial transmission at any given wavelength shorter than about 193 nm. Typically, if the glass is doped with OH or OD only, but not both, the higher the concentration of OH or OD in the glass, the longer the wavelength of the absorption edge, and the lower the initial transmission of the glass at a given wavelength. It has been found that water-free dry silica glass has an absorption edge of about 156 mm and a silica glass containing about 1000 ppm OH (but essentially free of OD) has an absorption edge of about 170 nm. Therefore, in order to obtain silica glass having an absorption edge at a short wavelength and/or a high initial transmission at a given wavelength, particularly at wavelengths with potential significant usage, such as at 172 nm, 165 nm and/or 157 nm, which for some applications (such as lithography devices operating at about 157 nm) are highly desired, silica glass containing low level of water (OH and OD) is highly desired. Without the intention or necessity to be bound by any particular theory, it is believed that Si—OH and/or Si—OD bonds present in the silica glass network tends to have a high absorption at short wavelengths such as 157 nm and the bond energy thereof are not efficient to withstand the high energy of the photons at such short wavelengths. Breakage of these bonds causes high absorbing species in the glass network.

In an effort to obtain silica glass with a low level of water, various general approaches can be adopted. These include: (i) making silica glass in an environment essentially free of hydrogen by using silicon precursor materials essentially free of hydrogen, such as $SiCl_4$; (ii) stripping a water-containing silica perform comprised of silica particles, made by using H-containing silicon precursor materials and/or in a hydrogen-containing environment, using a drying agent.

It has been found that certain dopants in silica glass, including, but not limited to, Cl, alkali metals, alkaline earth metals, transition metals, and the like, are detrimental to the initial transmission and a plurality of other optical performances of high-purity silica glass at deep and vacuum UV wavelengths, including 193 nm and shorter wavelengths. Therefore, it is highly desired that such dopants are not introduced into the glass during the fabrication process, or that such dopants are removed by a purifying agent, prior to and/or during the formation of consolidated glass.

Halogen-containing compounds, including but not limited to F- and Cl-containing compounds, such as $Cl_2$, $SiF_6$, $CF_4$, $CCl_4$, and the like, alone, in combination, or in admixture with other agents, such as CO, and the like, are used as the drying agent and/or purifying agent in certain processes for making high-purity synthetic silica glass.

It is difficult, if not impossible, to make completely dry silica glass essentially free of OH and/or OD without leaving certain amounts of residual halogen originating from the drying and/or purifying agents used in the fabrication process. As mentioned supra, the inclusion of Cl in the glass is highly undesirable when the glass is used for short wavelength applications, even including about 193 nm. Without the need or necessity to be bound by any particular theory, it is believed that the Si—Cl bonds present in the glass network are susceptible to cleavage when the glass is exposed to high energy photons. Such cleavage results in highly absorbing species (color centers) such as E' center and non-bridging oxygen hole centers (NBOHC). Fortunately, contrary to Cl, the presence of fluorine in the silica glass is not detrimental to the transmission property of the glass at short wavelengths such as at 193 nm, 172 nm and even at 157 nm. Without the intention or necessity to be bound by any particular theory, it is believed that Si—F bonds present in the silica glass does not significantly absorb at these wavelengths, and that the high energy photons of 157 nm do not cause the breakage of Si—F bonds. It has been observed that F-doped silica glass essentially free of water and Cl has higher initial transmission at 157 nm than non-F-doped silica glass comprising OH at equivalent concentration in terms of mole·cm$^{-3}$. It has been demonstrated by the present inventors that F-doped water-free silica glass can have an initial transmission at about 157 nm as high as 96%/cm (internal transmission with the surface reflection loss corrected).

However, unfortunately, the introduction of F into the glass network to displace the otherwise present OH and/or Cl, while capable of solving the absorption and initial transmission problems, causes an undesired side effect, namely, a high refractive index variation in the glass part. Without intending to be bound by any particular theory, this is believed to be caused by the higher impact on the refractive index of the glass of F. It has been found that the presence of F and OH causes a reduction of refractive index in silica glass. However, the impact of fluorine on index reduction is higher than that of OH. This means that the same level of concentration fluctuation of F in the glass causes higher refractive index variation in the glass than OH.

In many advanced optical applications, such as high precision lithographic devices, including but not limited to those with a working wavelength of about 157 nm, refractive index variation across the aperture of a lens element can be highly undesirable. Refractive index variation on the order of about 10 ppm or even lower is desired. For OH doped silica glass, it has been found that refractive index variation of less than about 10 ppm, in certain embodiments less than about 5 ppm, is achievable. Due to the significantly higher impact factor of F on the refractive index variation, F-doped silica with the same level of refractive index variation is difficult, if not possible, to achieve. This is especially true for silica glass materials with a high concentration of doped fluorine, such as those with a [F] higher than about 100 ppm by weight, more so for those with a [F] higher than about 200 ppm by weight. The higher the total concentration of fluorine in the glass, the higher the refractive index fluctuation can be caused by the same percentage of fluorine concentration variation. Because of the nature of the fabrication of the high purity synthetic silica glass, fluorine concentration variation in an F-doped silica glass is almost inevitable. Thus, in order to obtain a silica glass with a threshold index variation requirement, the fluorine concentration in the glass cannot exceed a certain amount.

Once doped into the network of a silica glass material, fluorine atoms are difficult to remove or move, unlike OH or Cl-essentially, it has higher affinity to the silica glass network than all other stripping agents. Therefore, limitation of final concentration of F in the consolidated glass means that the concentration of F-containing drying and/or purifying agent cannot be too high. Such restriction on the concentration of F-containing drying and/or purifying agent naturally places constraints on the efficacy and efficiency of the drying and/or purifying processes. Typically, F-doped silica glass prepared by the soot process with a low level of fluorine tends to contain a certain level of water as well. Another problem caused by the high affinity of the fluorine to the glass network is the inherent difficulty of obtaining a homogeneous distribution thereof throughout the glass network. When treating a silica soot perform with a F-containing atmosphere, during the process of diffusion from the surface to the center, fluorine tends to bind first with the glass particles closer to the surface of the perform, leading to a fluorine-concentration gradient in the perform and eventually, the consolidated glass. Subsequent homogenization of the glass is typically difficult, costly, and risk introducing undesired contaminants and/or property traits to the glass.

Moreover, silica glass essentially free of water and fluorine has many undesirable property traits. It has been found that dry silica glass without doped hydrogen molecules in the glass network tends to have a very high induced absorption once exposed to high energy photons, even at wavelength as long as 248 nm and 193 nm. Thus, it has been proposed to dope molecular hydrogen molecules into the glass network. Hydrogen molecules can function to heal the damages caused to the glass network by exposure to high energy photons. However, it has been observed by the present inventors that, in dry silica glass essentially free of water and/or fluorine, the glass network tends to react with the hydrogen molecules doped therein during the process wherein hydrogen molecules are included into the glass network (a process termed "hydrogen loading"). The reduction of the glass network by hydrogen molecules creates unstable structures in the glass network, which are absorbing at short wavelengths in and of themselves, or which form absorbing color centers upon exposure to high energy photons at short wavelength such as 248 nm, 193 nm, and shorter wavelengths.

Therefore, there is a genuine need of a silica glass with a high initial transmission at wavelengths shorter than about 193 nm, a low level of refractive index variation other than an F-doped silica glass essentially free of OH.

In a totally unexpected manner, the present inventors have found that OD-doped synthetic silica glass tends to have higher initial transmission than comparably OH-doped silica at wavelengths shorter than about 193 nm, such as at about 172 nm, 165 nm and 157 nm, and tends to have a lower refractive index variation than silica glass doped with fluorine but essentially free of water. Therefore, OD-doped silica glass, optionally further doped with fluorine, represents a good compromise between F-doped silica glass essentially free of water and OH-doped silica glass.

Accordingly, in a first aspect, the present invention provides an article member having a light incident axis, comprising OD-doped silica glass having an absorption edge $\lambda(edge) \leq 165$ nm (in certain embodiments $\lambda(edge) \leq 163$ nm; in certain other embodiments $\lambda(edge) \leq 160$ nm, in certain other embodiments $\lambda(edge) \leq 158$ nm; in certain other embodiments $\lambda(edge) \leq 155$ nm); and a refractive index variation, when measured in a plane perpendicular to the axis, less than about 10 ppm, in certain embodiments less than about 5 ppm, in certain other embodiments less than about 3 ppm, in certain other embodiments less than about 3 ppm, in certain other embodiments less than about 1 ppm.

The short wavelength absorption edge of the silica glass of the optical member of the present invention is brought about by, inter alia, the presence of intentionally doped OD in the glass network. According to certain embodiments of the optical member of the present invention, the OD-doped silica glass has a [OD]≦200 ppm by weight, in certain embodiments [OD]≦150 ppm; in certain other embodiments [OD]≦100 ppm; in certain other embodiments [OD]≦50 ppm; in certain other embodiments [OD]≦20 ppm; in certain other embodiments [OD]≦10 ppm; in certain other embodiments [OD]≦5 ppm. According to certain embodiments of the optical member of the present invention, the OD-doped silica glass in the optical member comprises less than about 500 ppm by weight of fluorine, in certain embodiments less than about 300 ppm, in certain other embodiments less than about 200 ppm, in certain other embodiments less than about 100 ppm, in certain other embodiments less than about 50 ppm, in certain embodiments less than about 10 ppm, in certain embodiments less than about 5 ppm.

The OD-doped silica glass of the present invention can be desirably free of fluorine for the purpose of high refractive index homogeneity. However, in certain embodiments, especially where F-containing agents are used as the drying agent and/or purifying agent during the fabrication of the glass, the glass may comprise a small amount of fluorine in the network. According to certain embodiments of the optical member of the present invention, the OD-doped silica glass in the optical member comprises less than about 500 ppm by weight of fluorine, in certain embodiments less than about 300 ppm, in certain other embodiments less than about 200 ppm, in certain other embodiments less than about 100 ppm, in certain other embodiments less than about 50 ppm, in certain embodiments less than about 10 ppm, in certain embodiments less than about 5 ppm.

In order to obtain a high transmission and stable transmission during the life of the optical member of the present invention, it is desired that the glass comprises very low level of metals, especially sodium. Sodium, a ubiquitous metal found especially detrimental to transmission properties of silica glass for use at about 193 nm, is believed to be equally, if not more, detrimental at shorter wavelength such as 172 nm and 157 nm. Thus, according to certain embodiments of the optical member of the present invention, the OD-doped silica glass comprises less than about 50 ppb by weight of Na, in certain embodiments less than about 30 ppb, in certain other embodiments less than about 10 ppb, in certain other embodiments less than about 5 ppb, in certain other embodiments less than about 1 ppb.

Other alkali metals such as K, Rb, Cs, alkaline earth metals, such as Mg, Ca, Ba, Sr, and the like, transition metals, such as Ti, Fe, N1, Ag, Cu, and the like, as well as certain main group metals, such as Ge, Ga, Sn, Pb, Sb, In, Tl, and the like, were found to be detrimental to the transmission and other optical performance of high-purity silica glass operating at about 193 nm. They are believed to be equally, if not more, detrimental to the optical performance of the glass at even shorter wavelength such as at about 172 nm and 157 nm. Therefore, it is desired that, in the silica glass of the optical member of the present invention, such metals are present at a very low level. It is desired that, in certain embodiments, the silica glass of the optical member of the present invention comprises each of the metal mentioned above at below about 50 ppb by weight; in certain other embodiments, below about 30 ppb by weight; in certain other embodiments, below about 10 ppb by weight; in certain other embodiments, below about 5 ppb by weight, in certain embodiments below about 1 ppb by weight. In certain embodiments, it is desired that the silica glass comprised in the optical member of the present invention comprise, in total, all metals at a concentration of below about 100 ppb by weight, in certain other embodiments below about 50 ppb, in certain other embodiments below about 20 ppb, in certain other embodiments below about 10 ppb.

Due to the undesirability of OH in the silica glass as discussed supra, it is desired that, according to certain embodiments of the optical member of the present invention, the OD-doped silica glass has a ratio of $n(OD)/(n(OH)+n(OD))$ of higher than about 0.98, in certain embodiments higher than about 0.99.

As discussed supra, the inclusion of hydrogen molecules in the glass network of the silica glass of the optical member of the present invention is highly advantageous for a plurality of applications. Thus, according to certain embodiments of the optical member of the present invention, the OD-doped silica glass comprised therein is doped with molecular hydrogen at a concentration of [MH], wherein $1\times10^{15}$ molecules/cm$^3 \leq$ [MH]$\leq 1\times10^{18}$ molecules/cm$^3$; in certain embodiments $1\times10^{15}$ molecules/cm$^3 \leq$[MH]$\leq 5\times10^{17}$ molecules/cm$^3$; in certain embodiments $1\times10^{15}$ molecules/cm$^3 \leq$[MH]$\leq 1\times10^{17}$ molecules/cm$^3$; in certain embodiments $1\times10^{15}$ molecules/cm$^3 \leq$[MH]$\leq 5\times10^{16}$ molecules/cm$^3$; in certain embodiments $1\times10^{16}$ molecules/cm$^3 \leq$[MH]$\leq 1\times10^{18}$ molecules/cm$^3$; in certain embodiments $1\times10^{16}$ molecules/cm$^3 \leq$[MH]$\leq 5\times10^{17}$ molecules/cm$^3$; in certain embodiments $1\times10^{16}$ molecules/cm$^3 \leq$[MH]$\leq 1\times10^{17}$ molecules/cm$^3$; in certain embodiments $1\times10^{16}$ molecules/cm$^3 \leq$[MH]$\leq 5\times10^{16}$ molecules/cm$^3$.

The present inventors have observed that molecular hydrogen can undergo exchange reactions with the OH/OD present in the glass network of the silica glass, especially when the glass is heated to an elevated temperature (such as at about 1000° C.) or exposed to high energy irradiation. If the glass is doped with H$_2$ and OD but no OH, such exchange reaction would result in the formation of OH in the glass network. Thus, according to certain embodiments of the optical member of the present invention, the OD-doped silica glass is doped with H$_2$ at a concentration such that $[H_2](m)/[OD](m) \leq 0.1$, in certain embodiments $[H_2](m)/[OD] \leq 0.1$, in certain other embodiments $[H_2](m)/[OD](m) \leq 0.05$, in certain other embodiments $[H_2](m)/[OD](m) \leq 0.01$, where $[H_2](m)$ and $[OD](m)$ are concentrations of H$_2$ and OD in the glass in mole-cm$^{-3}$, respectively.

For reasons mentioned supra, it is desired that the OD-doped silica glass comprised in the optical member of the present invention is doped with D$_2$ instead of H$_2$. According to certain embodiments of the optical member of the present invention, the OD-doped silica glass is essentially free of H$_2$, but is doped with D$_2$ at a concentration of [D$_2$], wherein $1\times10^{15}$ molecules/cm$^3 \leq$[D$_2$]$\leq 1\times10^{18}$ molecules/cm$^3$ in certain embodiments $1\times10^{15}$ molecules/cm$^3 \leq$[D$_2$]$\leq 5\times10^{17}$ molecules/cm$^3$; in certain embodiments $1\times10^{15}$ molecules/cm$^3 \leq$[D$_2$]$\leq 1\times10^{17}$ molecules/cm$^3$; in certain embodiments $1\times10^{15}$ molecules/cm$^3 \leq$[D$_2$]$\leq 5\times10^{16}$ molecules/cm$^3$; in certain embodiments $1\times10^{16}$ molecules/cm$^3 \leq$[D$_2$]$\leq 1\times10^{18}$ molecules/cm$^3$; in certain embodiments $1\times10^{16}$ molecules/cm$^3 \leq$[D$_2$]$\leq 5\times10^{17}$ molecules/cm$^3$; in certain embodiments $1\times10^{16}$ molecules/cm$^3 \leq$[D$_2$]$\leq 1\times10^{17}$ molecules/cm$^3$; in certain embodiments $1\times10^{16}$ molecules/cm$^3 \leq$[D$_2$]$\leq 5\times10^{16}$ molecules/cm$^3$.

As mentioned supra, due to its negative impact on the transmission property of silica glass in the deep UV and vacuum UV ranges, Cl is highly undesired. Nonetheless, Cl-containing agents may be advantageously used as the drying and/or purifying agent in the fabrication process of the OD-doped glass for use in the optical member of the present invention. Thus, the OD-doped silica glass for use in the optical member of the present invention may comprise Cl at a low concentration. According to certain embodiments of the optical member of the present invention, the OD-doped silica glass comprises chlorine at a concentration of [Cl], where $[Cl] \leq 10$ ppm by weight, in certain embodiments $[Cl] \leq 5$ ppm, in certain other embodiments $[Cl] \leq 1$ ppm.

According to certain embodiments of the optical member of the present invention, the optical member is a photomask substrate for use at a wavelength shorter than 190 nm.

According to certain embodiments of the optical member of the present invention, the optical member is a photomask substrate for use in photolithography at about 157 nm.

According to certain embodiments of the optical member of the present invention, the optical member is lamp envelope for a light source emitting light with a wavelength shorter than 190 nm.

According to certain embodiments of the optical member of the present invention, the optical member is a refractive lens element for use in connection with UV radiation at about 165 nm.

According to certain embodiments of the optical member of the present invention, the optical member is a refractive lens element for use in connection with an excimer laser at about 157 nm.

According to certain embodiments of the optical member of the present invention, the optical member is a pellicle of a photomask for use at lithographic device operating at a wavelength shorter than 175 nm.

According to certain embodiments of the optical member of the present invention, the OD-doped silica glass has an initial transmission at about 157 nm of at least 50%/cm, in certain embodiments at least 60%/cm, in certain other embodiments at least 70%/cm.

Another contemplated optical member of the present invention is an optical waveguide comprising the OD-doped silica glass for transmitting UV irradiation, especially UV irradiation at a wavelength shorter than about 248 nm, such as at about 193 nm, 172 nm and 157 nm, and the like. Desirably, in such waveguide, the OD-doped silica glass is comprised in the structure in which the transmitted light travels. the high transmission and low loss of the glass is conducive to the overall efficiency of the optical waveguide. The waveguide may be an optical fiber, a planar waveguide, and the like.

The present inventors have found that the absorption cross-section of OD is lower than that of OH in high purity silica glass. Accordingly, higher concentrations of OD than OH can be tolerated in a silica glass for a given application with prescribed absorption target. This means that in some situations where a drying agent must be used in the fabrication process to reach the required low level of OH concentration, no drying agent, or lower amount of drying agents, would be needed for OD-containing silica. No or less residual halogens would be incorporated in the glass leading to better laser damage resistance and/or better index homogeneity. In other words, in OD-doped silica one can achieve high transmission without the use of drying agents and the consequent issues associated with the incorporation of halogens into the glass.

In cases where a drying agent is used and the process results in a silica that is not completely dry and containing OY (including OH and OD), it is expected that the higher the ratio of [OD]/([OD]+[OH]) in the glass, the higher the transmission of the glass, at a given [OH]+[OD]. For example, in a process tailored to leave very low residual levels of fluorine in the glass which typically leaves some residual OH in the glass, replacing the OH with OD would result in a better transmitting glass in the deep UV and vacuum regions where OH is known to be absorbing.

The present inventors have found that, when doping silica glass with molecular hydrogen, if the glass has a higher level of OY (including OH and OD), the glass tends to tolerate high temperature hydrogen loading better. On the contrary, for dry silica glass or silica glass with very low level of OY, hydrogen doping at elevated temperature can lead to creation of absorption centers in the glass due to the reactions between hydrogen and the glass network. Therefore, hydrogen loading of silica glass with low level of OY typically requires a low loading temperature if such absorption centers should be avoided. Because the hydrogen loading process is essentially a diffusion process, the speed is highly temperature dependent. To achieve a given molecular hydrogen concentration in the silica glass, loading at 800° C. needs significantly less time than loading at about 400° C. Thus, for applications where molecular hydrogen is needed in the glass, the use of OD-doped silica glasses may allow for a more efficient hydrogen loading process. The fact that the tolerable level of OD is higher than that of OH at a given transmission target should allow for the production of a silica glass with lower hydrogen reactivity. This means that higher $H_2$ loading temperatures and shorter loading times could be used for OD-doped silica glass than OH-doped silica glass at a prescribed transmission level.

Other benefits of being able to incorporate higher levels of OD than OH include (1) lower viscosity of the glass at a given temperature and, therefore, potentially lower reforming temperatures if high temperature reforming is needed and (2) higher resistance to formation of oxygen-deficient centers (ODCs) during high temperature processing.

The substitution of OD for OH in flame hydrolysis silica glasses could be very beneficial. The flame hydrolysis process produces very large, very homogeneous pieces of silica in a single step. In the past, the naturally high OH level of flame hydrolysis silica has limited its use to ≧193 nm applications and thin parts for use at 172 nm. The substitution of OD for OH would shift the UV edge to shorter wavelengths, thereby extending the usefulness of flame hydrolysis silica glasses to shorter wavelengths and/or thicker parts.

We have discovered that the absorption cross-section (σ) of deuteroxyl (σ(OD)) in silica is smaller than that of hydroxyl (σ(OH)) in silica at wavelengths below 193 nm.

High purity silica glasses containing various concentrations of OH and OD were prepared by the OVD soot-to-glass process. The OH or OD concentration of the glass was set by controlling the $H_2O$ or $D_2O$ vapor partial pressure in the atmosphere during the consolidation process. Samples were cut from the glass preforms and polished to 10×15×20 mm. Transmission measurements were made through the 10 mm pathlength using a Mcpherson S2000 VUV spectrophotometer operated under vacuum. Prior to VUV transmission measurements, the samples were cleaned in an $O_2$ plasma system to remove surface contamination. FTIR measurements were also done on the samples through the 10 mm pathlength to determine the OH or OD content of the samples as described supra.

FIG. 1 shows transmission data from about 150-200 nm for a series of silica glasses containing up to about 1250 ppm by weight OH and up to about 150 ppm by weight OD. To obtain FIG. 1, the raw transmission data for each sample was corrected so that the transmission at 220 nm matched that of the dry, F-doped silica sample at 220 nm, i.e. by multiplying the data by a factor 89.63% T(220 nm). The samples A, B, C, D, E, F, G and H have the following composition as shown in TABLE I:

TABLE I

| Example | [OH] (ppm by weight) | [OD] (ppm by weight) | [F] (ppm by weight) |
|---------|----------------------|----------------------|---------------------|
| A | 0 | 0 | 5000 |
| B | 0.5 | 22 | 200 |
| C | 0 | 58 | 0 |
| D | 0 | 142 | 0 |
| E | 11.5 | 0 | 200 |
| F | 82 | 0 | 0 |
| G | 144 | 0 | 0 |
| H | 1235 | 0 | 0 |

Figure 2:
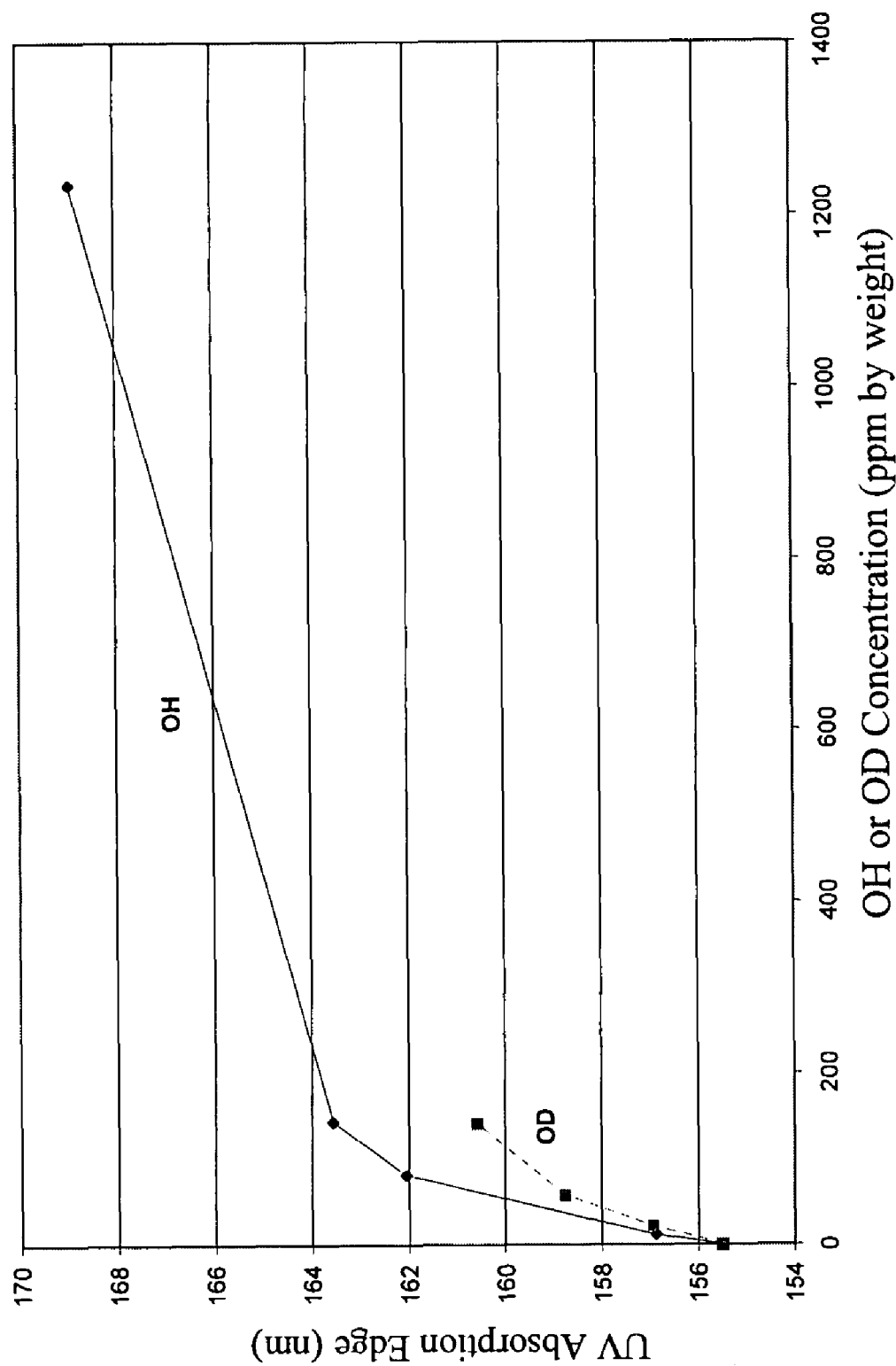
FIG. 2 is a diagram showing the UV absorption edge of a series of OH- and OD-doped silica glasses.

Fluorine does not introduce absorption at these wavelengths. The primary effect of OH and OD is to shift the UV absorption edge to longer wavelengths. The UV edge of the dry silica glass is at about 155.5 nm while the UV edge of the 1235 ppm OH glass is around 169 nm. In the latter case, the OH clearly produces absorption to wavelengths approaching 180 nm. OD also shifts the UV absorption edge to shorter wavelengths, but the effect is not as large. This can be seen in FIG. 2 where the position of the UV edge is plotted as a function of OH or OD concentration.

The effect of a species on the transmission of a material at any given wavelength is defined by its absorption cross-section at that wavelength according the relationship:

$$ABS(\lambda) = \sigma(\lambda) \cdot N$$

where ABS(λ) is absorption in $cm^{-1}$ at wavelength λ, N is concentration of that particular species in molecules/$cm^3$, and σ(λ) is the absorption cross-section in $cm^2$ at wavelength λ. Absorption cross-section σ(λ) can be obtained by plotting ABS(λ) as a function of N and performing a linear fit to the data. The slope of the linear fit is σ(λ).

In order to quantify the impact of OH and OD on the transmission of silica, we calculated the absorption cross-section for each species at wavelengths from 155 nm to 172 nm. The transmission data in FIG. 1 were converted to absorption (base 10) using the relationship:

$$ABS(\lambda) = -\log\frac{T(\lambda)}{100},$$

where T(λ) is transmission at wavelength λ in %/cm. OH and OD concentrations were converted from ppm by weight to molecules/cm³ using the formula:

$$N = \frac{[OY] \times 6.02 \times 10^{23} \times 2.2 \times 10^{-6}}{M}$$

where [OY] is the concentration of OH or OD in terms of ppm by weight, and M is the molecular weight of OH or OD (approximately 17 for OH and approximately 18 for OD).

Figure 3:
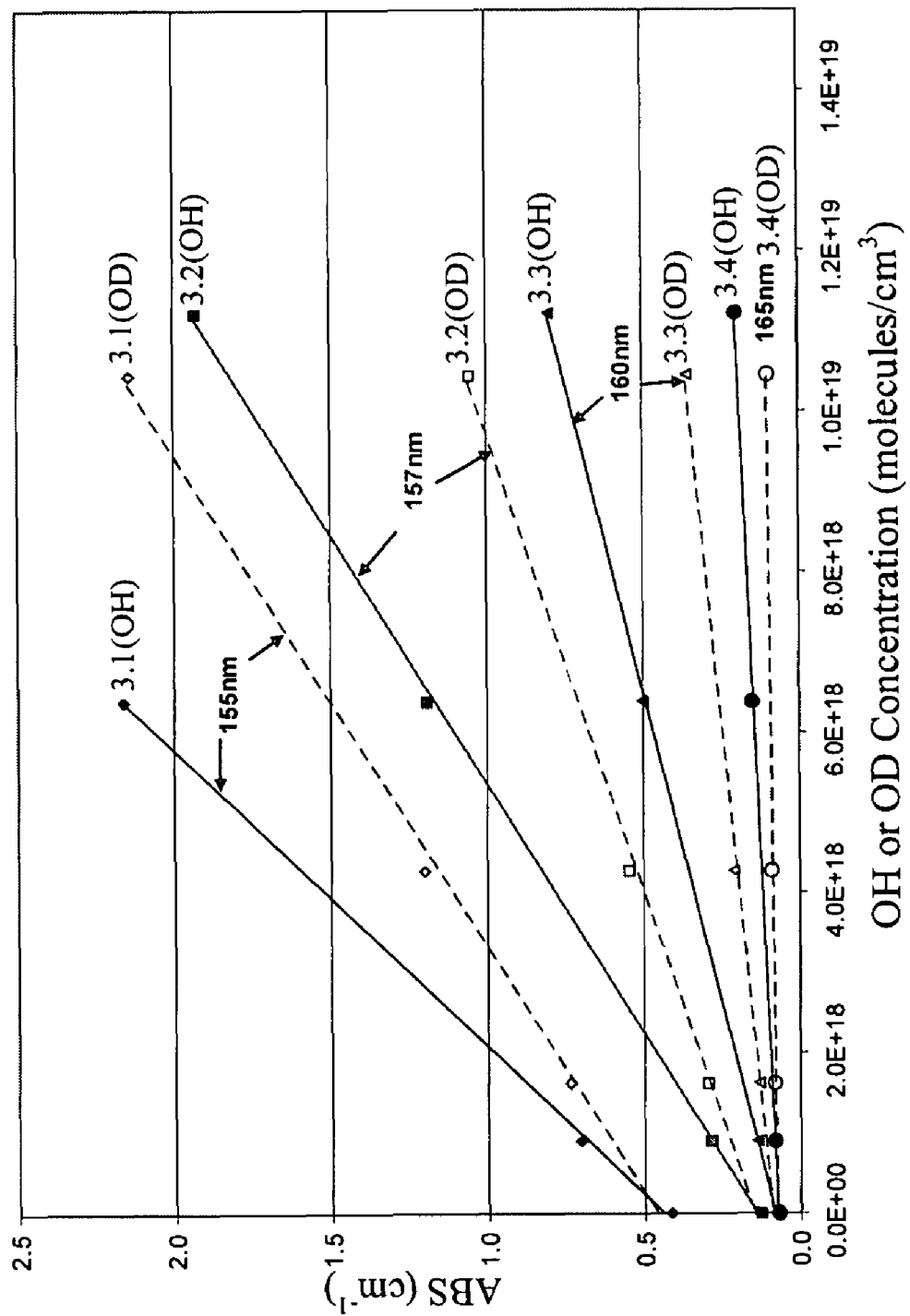
FIG. 3 is a diagram showing absorption as a function of OH or OD concentration in silica at various wavelengths.
Figure 4:
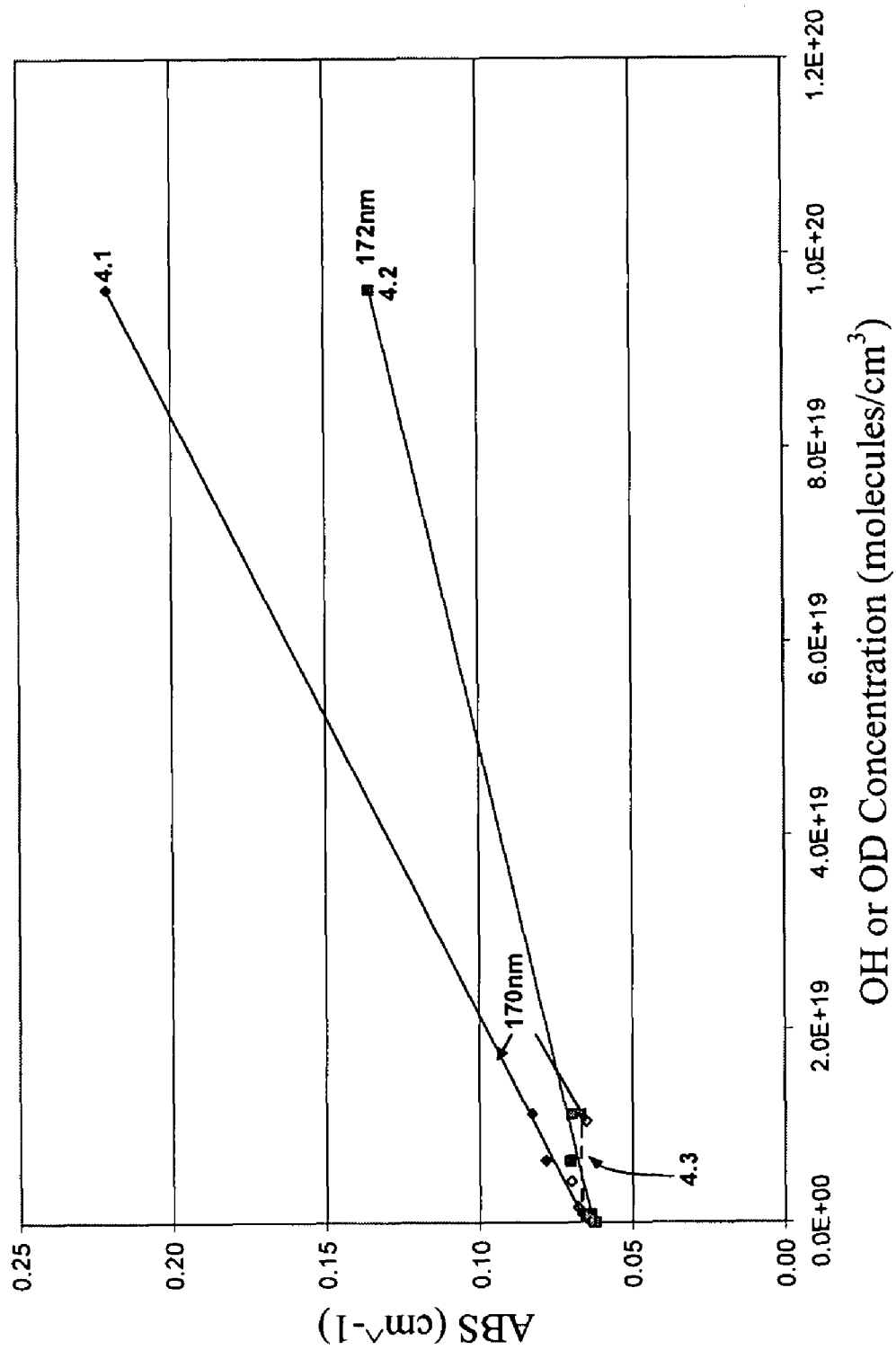
FIG. 4 is a diagram showing absorption as a function of OH or OD concentration in silica at various wavelengths.
Figure 5:
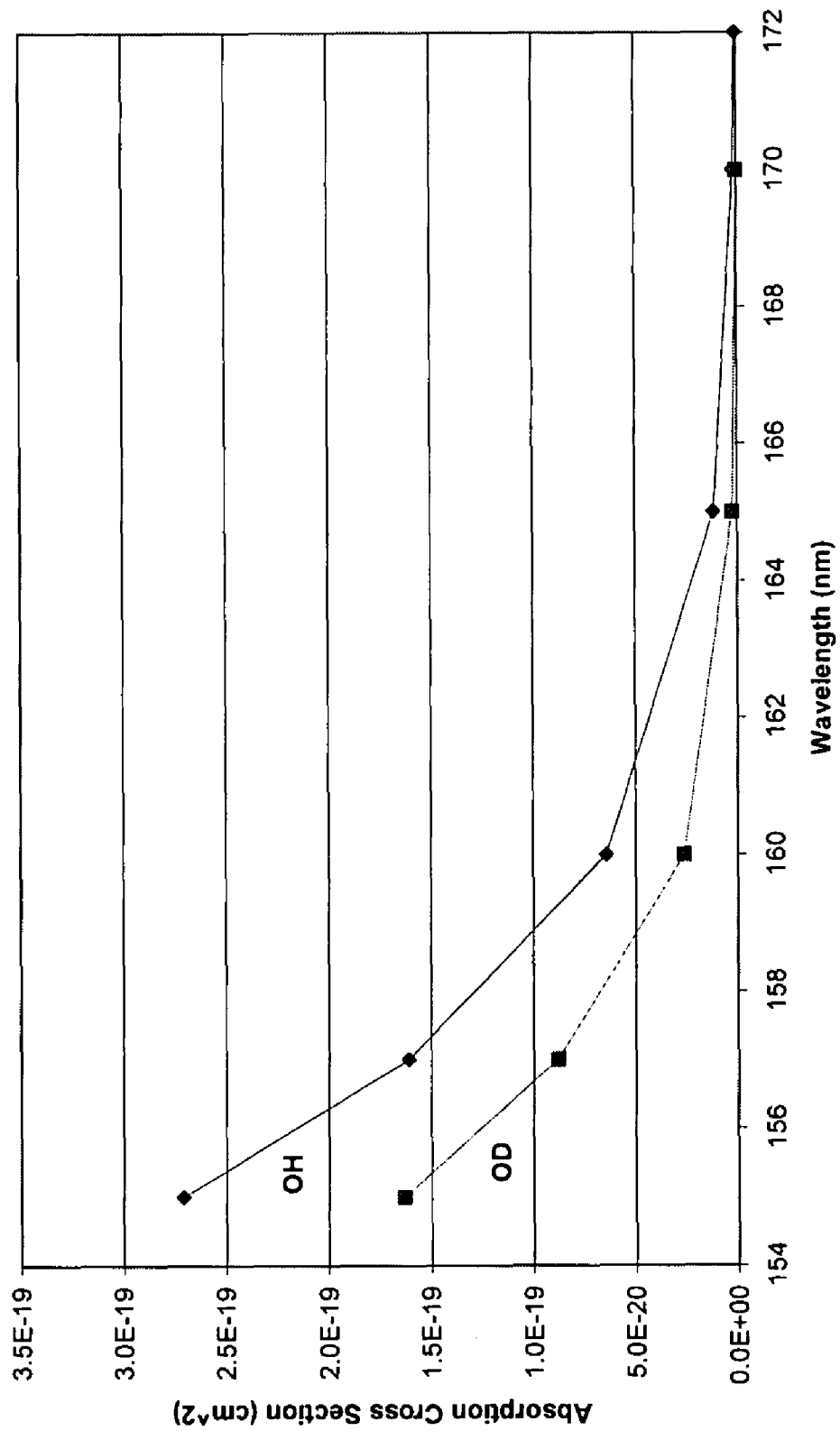
FIG. 5 is a diagram showing the absorption cross-section of OH and OD in silica glass.

FIGS. 3 and 4 show plots of ABS(λ) as a function of N for OH-doped (filled solid symbols) and OD-doped (open symbols) silica for λ=155 nm, 157 nm, 160 nm, and 165 nm., 170 nm, and 172 nm. In FIGS. 3, 3.1(OH), 3.2(OH), 3.3(OH) and 3.4(OH) are curves of OH-doped glasses; 3.1(OD), 3.2(OD), 3.3(OD) and 3.4(OD) are curves of OD-doped glasses. In FIGS. 4, 4.1 and 4.2 are curves of OH-doped glasses; and 4.3 is a curve of OD-doped glasses. Linear fits to the data are indicated by the solid and dashed lines. At all wavelengths, the absorption cross-section of OD is shown to be less than that of OH in silica. Notice that the absorption cross-section of OD is essentially zero at 170 nm while OH still has a measurable impact on absorption at 172 nm. The result is further depicted in FIG. 5 where we plot σ(OH)(λ) and (OD)(λ), for λ=155-172 nm.

Figure 6:
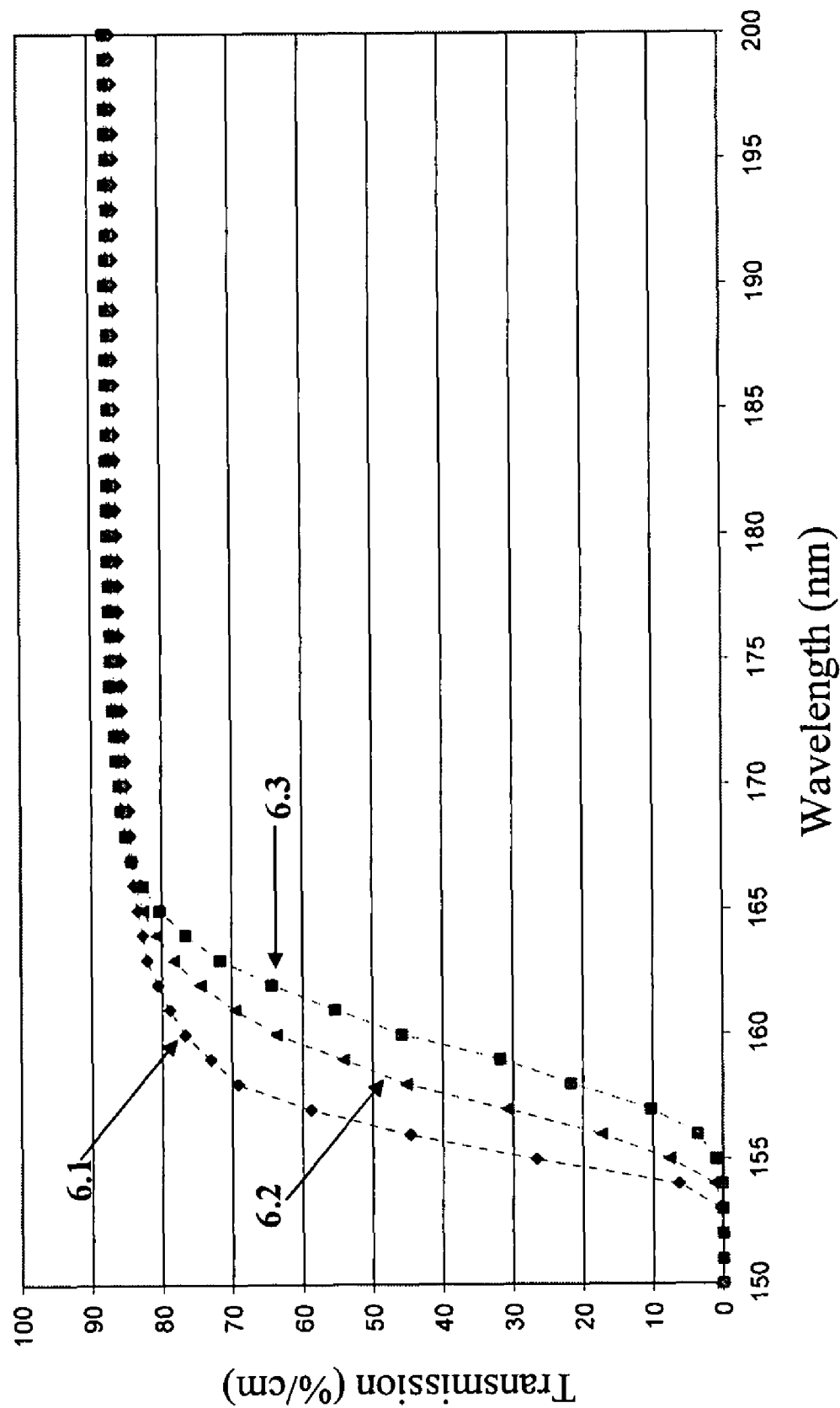
FIG. 6 is a diagram showing the transmission of a series of OD-doped silica glasses, loaded with $H_2$, in wavelength from about 150 nm to about 200 nm.

FIG. 6 shows the transmission curves from 150-200 nm of a series of OH and/or OD-doped silica glasses, doped with $H_2$ molecules. Hydrogen loading was done by exposing the 10 mm×15 mm×20 mm polished samples to 100 atm of a 0.1% H2-N2 gas mixture at 350° C. for 23 days. In this figure, 6.1 comprises 200 ppm by weight F, ~3 ppm by weight OD, ~0.3 ppm by weight OH, and 1E17 molecules·cm⁻³ $H_2$; 6.2 comprises about 58 ppm by weight OD and 1E17 molecules·cm⁻³ $H_2$; and 6.3 comprises 142 ppm by weight OD and 1E17 molecules·cm⁻³ $H_2$.

Our results show that the same transmission can be obtained with a higher concentration of OD than OH in silica. Conversely, for the same concentration of OH or OD, the silica containing OD will have higher transmission.

It will be apparent to those skilled in the art that various modifications and alterations can be made to the present invention without departing from the scope and spirit of the invention. Thus, it is intended that the present invention cover the modifications and variations of this invention provided they come within the scope of the appended claims and their equivalents.

What is claimed is:

1. An optical member having a light incident axis, comprising an OD-doped silica glass having an absorption edge λ(edge) ≤165 nm, wherein the OD-doped silica glass has a ratio of n(OD)/(n(OH)+n(OD)) of higher than about 0.98.

2. An optical member according to claim 1, wherein the OD-doped silica glass further comprises fluorine.

3. An optical member according to claim 1, wherein the OD-doped silica glass comprises less than about 5000 ppm by weight of fluorine.

4. An optical member according to claim 1, wherein the OD-doped silica glass comprises less than about 50 ppb by weight of Na.

5. An optical member according to claim 1, wherein the OD-doped silica glass has a concentration of [OD] ≤200 ppm by weight.

6. An optical member according to claim 1, wherein the OD-doped silica glass is doped with $H_2$ at a concentration such that [$H_2$](m)/[OD](m) ≤0.1.

7. An optical member according to claim 1, wherein the OD-doped silica glass is doped with $D_2$ at a concentration of [$D_2$], wherein $1\times10^{15}$ molecules/cm³ ≤[$D_2$] ≤$1\times10^{18}$ molecules/cm³.

8. An optical member according to claim 1, wherein the OD-doped silica glass comprises chlorine at a concentration of [Cl], where [Cl] ≤10 ppm by weight.

9. An optical member according to claim 1, which is a photomask substrate for use at a wavelength shorter than 190 nm.

10. An optical member according to claim 9, which is a photomask substrate for use in photolithography at about 157 nm.

11. An optical member according to claim 1, which is a lamp envelope for a light source emitting light with a wavelength shorter than 190 nm.

12. An optical member according to claim 1, which is a refractive lens element for use in connection with a UV radiation shorter than 165 nm.

13. An optical member according to claim 1 which is a refractive lens element for use in connection with an excimer laser at 157 nm.

14. An optical member according to claim 1 which is a pellicle of a photomask for use at lithographic device operating at a wavelength shorter than 175 nm.

15. An optical member according to claim 1, wherein the OD-doped silica glass has an initial transmission at about 157 nm of at least 50% /cm.

16. An optical member according to claim 1, which is an optical waveguide comprising the OD-doped silica glass.

17. An optical member according to claim 16, which is an optical waveguide for transmitting at least partly light having a wavelength shorter than about 248nm.

18. An optical member according to claim 16, which comprises the OD-doped silica glass in the light transmitting part thereof.

19. An optical member according to claim 16, which comprises an optical fiber.

20. An optical member according to claim 17, which is an optical waveguide for transmitting at least partly light having a wavelength shorter than 193 nm.

21. An optical member having a light incident axis, comprising a silica glass doped with OD and fluorine and having an absorption edge λ(edge) ≤165 nm.

22. An optical member having a light incident axis, comprising an OD-doped silica glass having an absorption edge λ(edge) ≤165 nm, wherein the OD-doped silica glass is doped with $D_2$ at a concentration of [$D_2$], and wherein $1\times10^{15}$ molecules/cm³ ≤[$D_2$] ≤$1\times10^{18}$ molecules/cm³.

* * * * *